United States Patent
Fu et al.

(10) Patent No.: US 6,517,637 B1
(45) Date of Patent: Feb. 11, 2003

(54) METHOD FOR CLEANING WAFERS WITH IONIZED WATER

(75) Inventors: Chiang Fu, Hsin-chu (TW); Yu-Chyi Harn, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 705 days.

(21) Appl. No.: 08/899,176

(22) Filed: Jul. 23, 1997

(51) Int. Cl.[7] ................................................ B08B 7/04
(52) U.S. Cl. .................................. 134/6; 134/2; 134/3
(58) Field of Search ............................ 134/1.3, 2, 6, 9, 134/902, 3

(56) References Cited

U.S. PATENT DOCUMENTS

| | | | |
|---|---|---|---|
| 4,569,695 A | * | 2/1986 | Yamashita et al. .............. 134/1 |
| 5,175,124 A | * | 12/1992 | Winebarger |
| 5,213,621 A | * | 5/1993 | Ivankovits et al. ............ 134/3 |
| 5,336,371 A | * | 8/1994 | Chung et al. |
| 5,645,737 A | * | 7/1997 | Robinson et al. ......... 134/1.3 X |

OTHER PUBLICATIONS

Handbook of Semiconductor Wafer Cleaning Technology, Noyes Publications, p. 78.., 1993.*
Hawley's Condensed Chemical Dictionary, VNR, pp. 223 and 537, 1993.*
Eitoku, Post–CMP Cleaning Technology, Semicon Korea 95, pp. 29–36, Jan. 1995.*
Handbook of Semiconductor Wafer Cleaning Technology, NP, pp. 28–67, 1993.*
Li et al, Surface passivation and microroughness of (100) silicon etched in aqueous halide (HF, HCI, HBr, HI) solutions, J. Appl. Phys, 77 (3), pp. 1323–1325, Feb. 1995.*
Li et al, Improvement and Evaluation of Drying Techniques for HF–last Wafer Cleaning, UCPSS '94, pp. 167–170, 1994.*

* cited by examiner

Primary Examiner—Alexander Markoff
(74) Attorney, Agent, or Firm—Tung & Associates

(57) ABSTRACT

The present invention provides a method for cleaning wafer surfaces in a scrubber by ion doped deionized water without the electrostatic discharge problem. The method can be carried out by first doping a quantity of deionized water with at least one species of ions from the group consisting of $OH^-$, $F^-$, $Cl^-$, $NH_4^+$ and $H^+$ any other suitable ions. The added ions significantly reduce the resistivity of the DI water such that DI water is no longer a perfect insulator and therefore, when sprayed onto wafer surfaces covered by an insulating material, the generation of electrostatic charges is significantly reduced. As a result, the undesirable effect of electrostatic discharge can be significantly reduced or eliminated and the yield of the wafer fabrication process can be improved.

5 Claims, 3 Drawing Sheets

METHOD FOR CLEANING WAFERS WITH IONIZED WATER

FIELD OF THE INVENTION

The present invention generally relates to a method for cleaning wafers and more particularly, relates to a method for cleaning wafers with deionized water by first doping the water with ions to reduce the resistivity of the water such that electrostatic discharge problem does not occur on the wafer surface.

BACKGROUND OF THE INVENTION

In the manufacture of semiconductor devices, a large quantity of deionized (DI) water is required to process integrated circuit wafers. The consumption of DI water increases with the size of the wafers. For instance, the consumption at least doubles in the processing of 200 mm size wafers when compared to the consumption in the processing of 150 mm size wafers. DI water is most frequently used in tanks and scrubbers for the frequent cleaning and rinsing of wafers in process. It is desirable that the surface of a wafer be cleaned by DI water after any process has been conducted on the wafer, i.e., oxide deposition, nitride deposition, SOG deposition or any other deposition or etching process. Such wafer cleaning step is accomplished by equipment that are installed either in-line or in a batch-type process.

For instance, a cassette-to-cassette wafer scrubbing system is one of the most used production systems for wafer cleaning prior to either a photoresist coating, oxidation, diffusion, metalization or CVD process. A typical automated wafer scrubber combines brush and solution scrubbing by DI water. The scrubber utilizes a hyperbolic high pressure spray of DI water with a retractable cleaning brush. A typical mechanical scrubbing process consists of rotating a brush near a wafer surface that is sprayed with a jet of high pressure DI water at a pressure between about 2,000 and about 3,000 psi. The brush does not actually contact the wafer surface, instead, an aquaplane is formed across the wafer surface which transfers momentum to the DI water. The movement of the DI water thus displaces and dislodges contaminating particles that have been deposited on the wafer surface. Contaminating particles are thus removed by a momentum transfer process. As a result, larger particles become more difficult to dislodge and remove from a wafer surface.

A typical wafer scrubbing process consists of a DI water spray step followed by a spin dry and nitrogen gas blow dry step. In a typical wafer scrubbing equipment, production rates are generally between 60 to 120 wafers per hour depending on the program length. The spinning speed of the wafer is between 500 to 10,000 rpm while under a water pressure of up to 6,000 psi.

In more recently developed wafer scrubbing systems, in-line systems are used which provide high pressure DI water scrubbing only while eliminating the possibility of wafer contamination by overloaded brushes. The water pressure in these systems range between 3,000 to 6,000 psi which are ejected from a nozzle mounted on an oscillating head. The wafer is spun when the oscillating spray is directed onto the wafer surface. After the cleaning step, wafer is dried by a pure nitrogen gas purge to promote rapid drying. After the scrubbing operation, wafers can be loaded into an in-line dehydration baking system for thorough drying. Batch-type systems are also used with DI water for cleaning, rinsing and drying prior to many IC processes. The systems can be programmed wherein wafers are loaded in cassettes before each cycle. One disadvantage of the batch system is their inability to be integrated into part of an automated wafer processing line.

In the conventional DI water cleaning systems, the basic requirements for the DI water cleaning system are that it provides a continuous supply of ultra-clean water with very low ionic content. It is believed that ionic contaminants in water, such as sodium, iron or copper when deposited onto a wafer surface can cause device degradation or failure. It is therefore desirable to eliminate all such ionic content from a DI water prior to using the water for cleaning wafers.

A conventional method of measuring the ionic content in DI water is by monitoring the water resistivity. A water resistivity of $18 \times 10^6$ Ohm-cm or higher indicates a low ionic content in the DI water. In a conventional water purifying system, several sections which include charcoal filters, electrodialysis units and a number of resin units to demineralize the water are used for purifying the water.

In the use of scrubbers to clean wafer surfaces, as scrubbers become a popular method to remove contaminating particles from wafer surfaces, a different problem is caused by the scrubbing action with DI water. When a DI water is extremely clean, i.e., without any ions present in the water, as indicated by a high resistivity of $18 \times 10^6$ Ohm-cm or higher, the DI water becomes a perfect insulating material. During a cleaning process of another perfect insulating material such as an oxide, nitride or SOG layer deposited on a wafer, the two insulating materials create an electrostatic charge on the wafer surface from the impingement action of the water jet on the wafer surface. The electrostatic charge build up on the surface of the wafer if not properly discharged, can result in severe damage to the devices already formed on the wafer. For instance, a common damage that is frequently observed is the shorting through of a gate oxide layer resulting in a device failure. The device failure then results in a serious drop in the product ion yield.

Referring initially to FIG. 1 wherein a graph illustrating a low yield wafer map obtained on a wafer sample that was processed by a conventional DI water scrubbing cleaning process is shown. In the graph, 0 indicates IC chips that are of a passing grade, while 3 indicates those IC chips that have failed and must be scrapped. It is seen that along the edges of the wafer map, most IC chips have failed due to the electrostatic discharge problems. The center portion of the wafer map indicates a majority of good chips were obtained since they were more shielded from the electrostatic discharge by the IC chips that surround them. The wafer map shown in FIG. 1 indicates a severely damaged wafer by the electrostatic discharge after a wafer cleaning process by non-doped DI water. Such a wafer would not be acceptable if a reasonable yield from the process is expected.

Referring now to FIG. 2, wherein the dependence of wafer yield on the electrostatic field strength is shown. It is seen that as the electrostatic field induced by static charge increases in the horizontal axis, the wafer yield is significantly affected and deteriorates from 93% to 91%. This represents a significant drop in the wafer yield and therefore a undesirable result due to damages caused by the stronger electrostatic field formed on the wafer surface.

Referring now to FIG. 3, wherein a graph illustrating the dependence of the electrostatic field formed on the DI water pressure is shown. The DI water pressure tested is in the range between about 1,200 psi and about 3,500 psi. It is seen that at approximately 1,200 psi water pressure, a 0.05 kV/inch of electrostatic field was formed. The electrostatic field strength greatly increases to 1.13 kV/inch and 1.16 kV/inch when the DI water pressure is increased to about 2,100 psi and about 2,900 psi, respectively. There is a large increase in the electrostatic field strength between 1,200 psi and 2,100 psi water pressure by almost 20 fold. The DI water pressure that impinges on the wafer surface is therefore a strong factor on the subsequent electrostatic field formed.

A study on the dependence of the electrostatic field strength on the nature of the coating material on the wafer surface is shown in FIG. 4. The data of the electrostatic field strength in kV/inch is used on the vertical axis, while different wafer sample lots are plotted on the horizontal axis. It is seen that for wafers that have a PREFERRED EMBODIMENT-oxide layer deposited on top and was subjected to DI water spray, the electrostatic field strength generated was between about 5 and about 6.2 V/inch. This is significantly higher, i.e., by approximately 5 fold of those generated on wafers that have a metal layer deposited on top. It is obvious that the metal layer when rubbing against the DI water does not generate any significant amount of electrostatic charge due to the conductive nature of metal.

It is therefore an object of the present invention to provide a method for cleaning a wafer surface with DI water that does not have the drawbacks and shortcomings of the conventional DI water scrubbing process.

It is another object of the present invention to provide a method for cleaning a wafer surface with DI water that does not produce an electrostatic field on the wafer surface.

It is a further object of the present invention to provide a method for cleaning a wafer surface with DI water that does not cause damages to the wafer due to electrostatic discharge problems.

It is another further object of the present invention to provide a method for cleaning a wafer surface in a scrubber utilizing DI water by first doping the water with suitable ions.

It is still another object of the present invention to provide a method for cleaning a wafer surface in a scrubber by DI water by doping the water with at least one species of ions selected from the group of $OH^-$, $F^-$, $H^+$, $Cl^-$ and $NH_4^+$ and $H^+$.

It is yet another object of the present invention to provide a method for cleaning a wafer surface in a scrubber utilizing DI water by doping the water with ions such that its resistivity falls substantially below $18 \times 10^6$ Ohm-cm.

It is still another further object of the present invention to provide a method for cleaning a wafer surface in a scrubber by DI water in which the DI water is first doped with ions such that a significantly lower resistivity in the water, i.e., less than $10^4$ Ohm-cm is obtained.

It is yet another further object of the present invention to provide a method for cleaning a wafer surface in a scrubber by using DI water in which a carboxylic acid or atomic acid is first mixed with the DI water to reduce its resistivity.

SUMMARY OF THE INVENTION

In accordance with the present invention, a method for cleaning a wafer surface in a scrubber by using deionized water is provided in which the DI water is first doped with at least one species of ions such that the resistivity of the water is significantly reduced so that electrostatic charge cannot be produced on the wafer surface during cleaning.

In a preferred embodiment, a method for cleaning a wafer surface in a scrubber can be carried out by first providing a quantity of deionized water, then adding ions to the quantity of deionized water such that the electrical resistivity of the water is reduced sufficiently so as to substantially not generating any electrostatic charge on the surface of the wafer, and then contacting the deionized water with a wafer surface.

In another preferred embodiment, a method for cleaning a wafer in a scrubber can be carried out by the steps of first providing a quantity of deionized water to a scrubber, then doping the quantity of deionized water with at least one species of ions such that the electrical resistivity of the water is less than $18 \times 10^6$ Ohm-cm, and then contacting a wafer with the doped deionized water.

In yet another preferred embodiment, a method for cleaning wafer surfaces in a scrubber by ion doped deionized water without electrostatic discharge problems can be carried out by first positioning at least one wafer in a scrubber, then providing a quantity of deionized water to the scrubber, then doping the quantity of deionized water with at least one species of ions selected from the group consisting of $OH^-$, $F^-$, $Cl^-$, $NH_4^+$ and $H^+$, and then contacting the ion doped water with the wafer surface.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a novel method for cleaning a wafer surface in a scrubber with DI water that utilizes an ion doped DI water such that the resistivity of water is reduced and consequently, the electrostatic charge build-up on the wafer surface during cleaning is reduced to eliminate any electrostatic discharge (ESD) problems which would otherwise damage the devices formed on the wafer. At least one species of ions can be suitably used to dope the deionized water which include $OH^-$, $F^-$, $Cl^-$, $NH_4^+$ and $H^+$ or any other suitable ions that will reduce the resistivity of the DI water. The objective is to reduce the resistivity of the DI water to a level below $18 \times 10^6$ Ohm-cm, preferably to a level below $10^4$ Ohm-cm, and more preferably to a level substantially below $10^2$ Ohm-cm such that the electrostatic charge build-up on the wafer surface when DI water impinges on the surface can be reduced.

The present invention novel method introduces ions or impurities back into a DI water in a scrubber cleaning process. The ions or impurities can be of any type depending on the end result desired. Serious device damages such as a gate oxide punch-through can be eliminated or substantially reduced.

The present invention novel method can be utilized in any scrubber cleaning process for wafers, and is particularly suited for scrubber cleaning of wafers that has an oxide, a nitride or a SOG layer deposited on top. In other words, whenever there is an insulating layer deposited on top of a wafer and when such wafer is subjected to DI water cleaning, severe electrostatic charge build-up occurs on the wafer such that electrostatic discharge may occur to damage devices that have already formed on the wafer. When there is a metal layer formed on top of a wafer, since metal is a perfect conductor and has extremely low resistivity, an electrostatic charge build-up caused by the impinging DI water is not observed. In a regular DI water where most ions have been removed to produce an extremely high resistivity, i.e., typically $18 \times 10^6$ Ohm-cm or larger, DI water acts as a perfect insulator which when rubbed against another perfect insulator such as an oxide layer or nitride layer on top of a wafer creates a significant electrostatic charge build-up.

In the present invention novel method of doping a deionized water, any suitable types of ions can be used as long as the resistivity of DI water can be effectively reduced. A suitable level of resistivity has been found to be substantially less than $18 \times 10^6$ Ohm-cm, preferably less than $10^4$ Ohm-cm, and more preferably less than $10^2$ Ohm-cm. Obviously, the lower the resistivity, the less likely electrostatic charge build-up problem will occur on the surface of the wafer.

Figure 1:
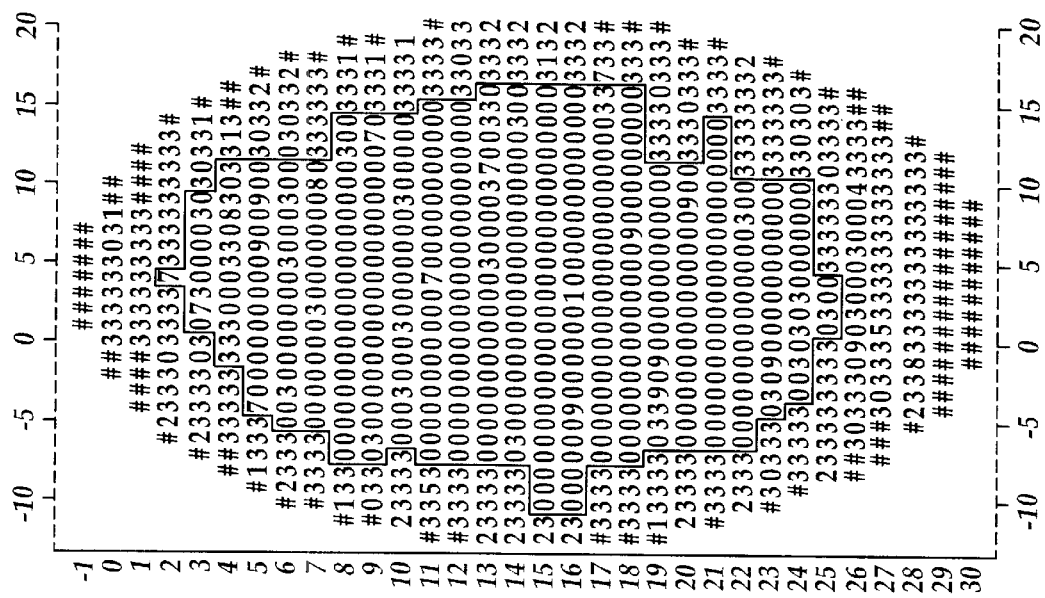
FIG. 1 is a graph illustrating a low yield wafer map on a wafer processed by a conventional DI water scrubbing method.
Figure 2:
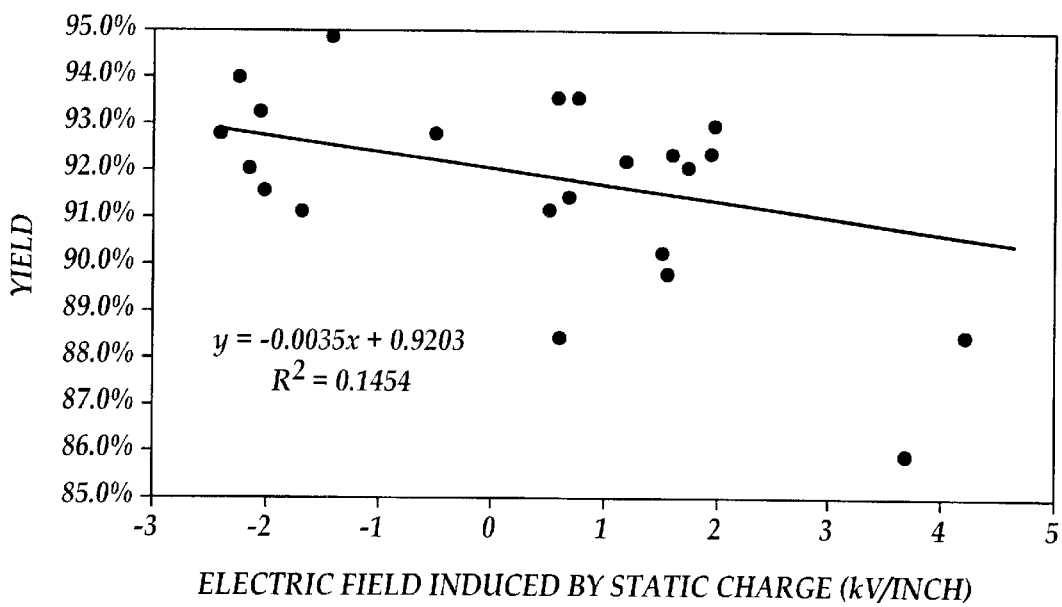
FIG. 2 is a graph illustrating the dependence of wafer yield on the electrostatic field strength.
Figure 3:
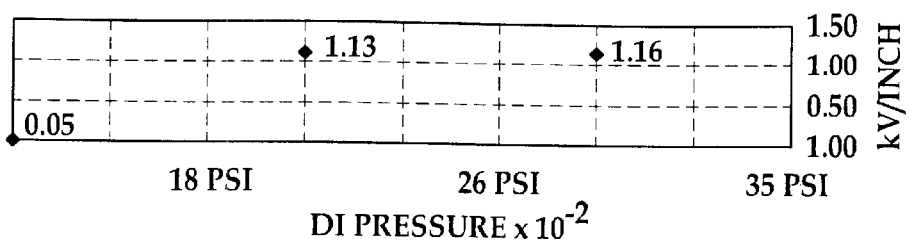
FIG. 3 is a graph illustrating the dependence of the electrostatic field strength on the DI water pressure.
Figure 4:
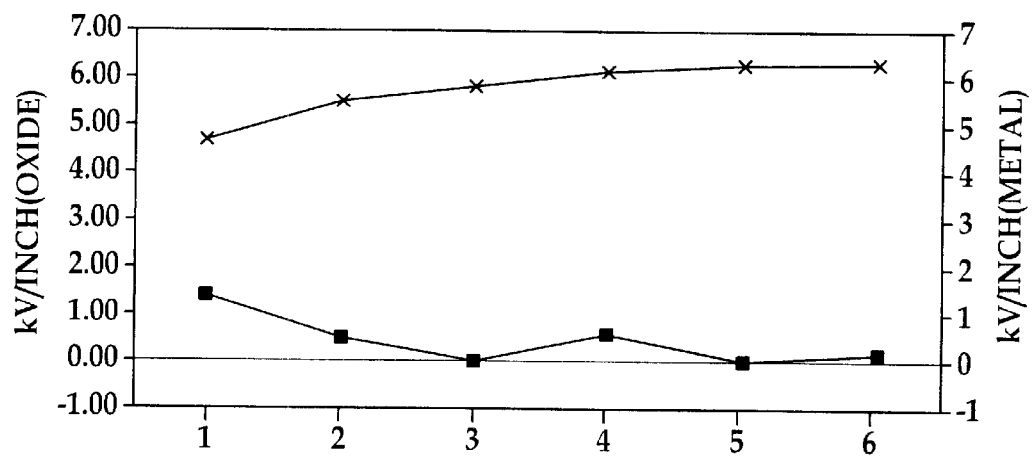
FIG. 4 is a graph illustrating the electric field strength generated on an insulating oxide layer and on a metal layer.
Figure 5:
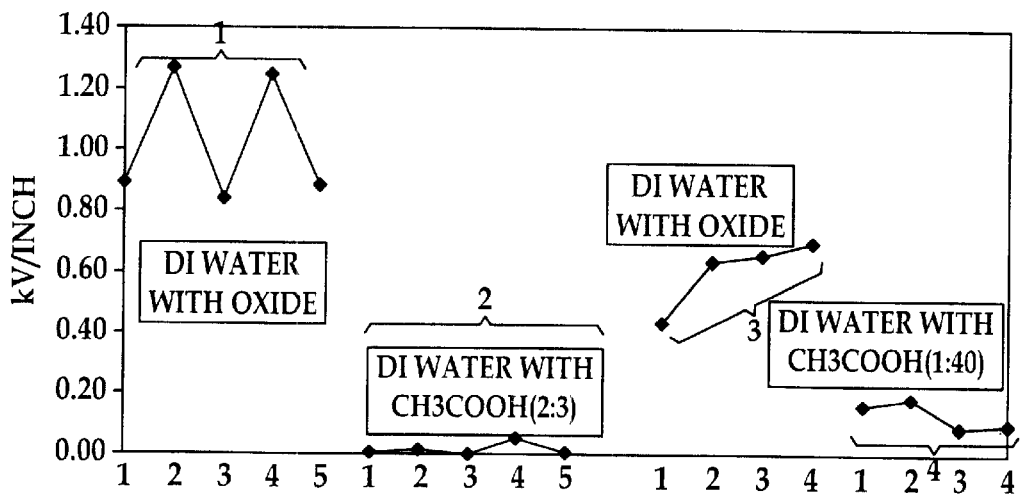
FIG. 5 is a graph illustrating the dependence of the electrostatic field strength on DI waters doped with different concentrations of ions.

Suitable types of ions can be selected from a variety of elements or groups of elements. For instance, a few of such suitable ions are $H^+$, $F^-$, $Cl^-$, $NH_4^+$ and $H^+$. The $OH^-$ ions can be easily supplied by $CH_3COOH$, $H_2CO_3$ or $HCOOH$ when it decomposes into positive and negative ions. The carboxylic acid or formic acid can be easily mixed with DI water prior to being supplied to a scrubber. Suitable mixing ratios of $CH_3COOH$/DI water, $H_2CO_3$/DI water or $HCOOH$/DI water can be anywhere between about 1:100 (acid/water) and about 1:1 (acid/water). Different results are obtained which indicate that the higher acid content in the DI water, the more effective is the water in not creating electrostatic charges when cleaning wafer surfaces. Some of these results are shown in FIG. 5. The DI water is normally injected onto a rotating wafer surface through a nozzle moving in an oscillating fashion. The water pressure on the wafer surface is normally larger than 1,000 psi, and can be as high as 8,000 psi. The injecting pressure depends on other processing parameters, such as the nature of the wafer surface and the speed that the wafer is rotated. The rotational speed of wafer is normally not less than 500 rpm, and can be as high as 5,000 rpm.

Referring now to FIG. 5 which shows the dependence of electrostatic field strength on the compositions of the DI water. The first set of data on the left in the graph illustrates wafer samples coated with an oxide layer that were sprayed with a non-doped DI water. The electrostatic field build-up is very high, i.e., in the range between about 0.8 and about 1.3 kV/inch. In the second set of data from the left, wafer samples similarly prepared with an oxide layer on top were sprayed with DI water mixed with a high concentration of $CH_3COOH$. The concentration used was two parts of $CH_3COOH$ and three parts of DI water. The effectiveness of the ion doped DI water can be clearly identified in these data. The electrostatic field build-up is close to 0, i.e., in the range of about 0.01 kV/inch which is a drastic reduction from data obtained by using non-doped DI water. In a second experiment, as indicated by the third and the fourth set of data shown in FIG. 5, wafer samples coated with an oxide layer are again tested by non-doped DI water and DI water doped with $CH_3COOH$ at a mix ratio of 1:40 (acid/water). The data obtained for wafer samples sprayed with non-doped DI water fall in the range between about 0.4 and about 0.7 kV/inch, while samples sprayed with doped DI water falls between 0.1 and 0.2 kV/inch. These data indicates that the concentration of ions in the DI water plays an important role in eliminating electrostatic charge build-up on the wafer surface. At a higher concentration level, as those shown by the second set of data in FIG. 5, the electrostatic charge build-up was almost non-existent. This is in a stark contrast with the fourth set of data in FIG. 5 which shows that as the concentration of ions decreases in the DI water, the electrostatic charge build-up increases as a result to a level significantly higher than those with much higher ion concentrations. The effectiveness of the present invention novel method for cleaning a wafer surface in a scrubber by using DI water that are doped with a suitable species of ions is therefore amply demonstrated by FIG. 5.

Figure 6:
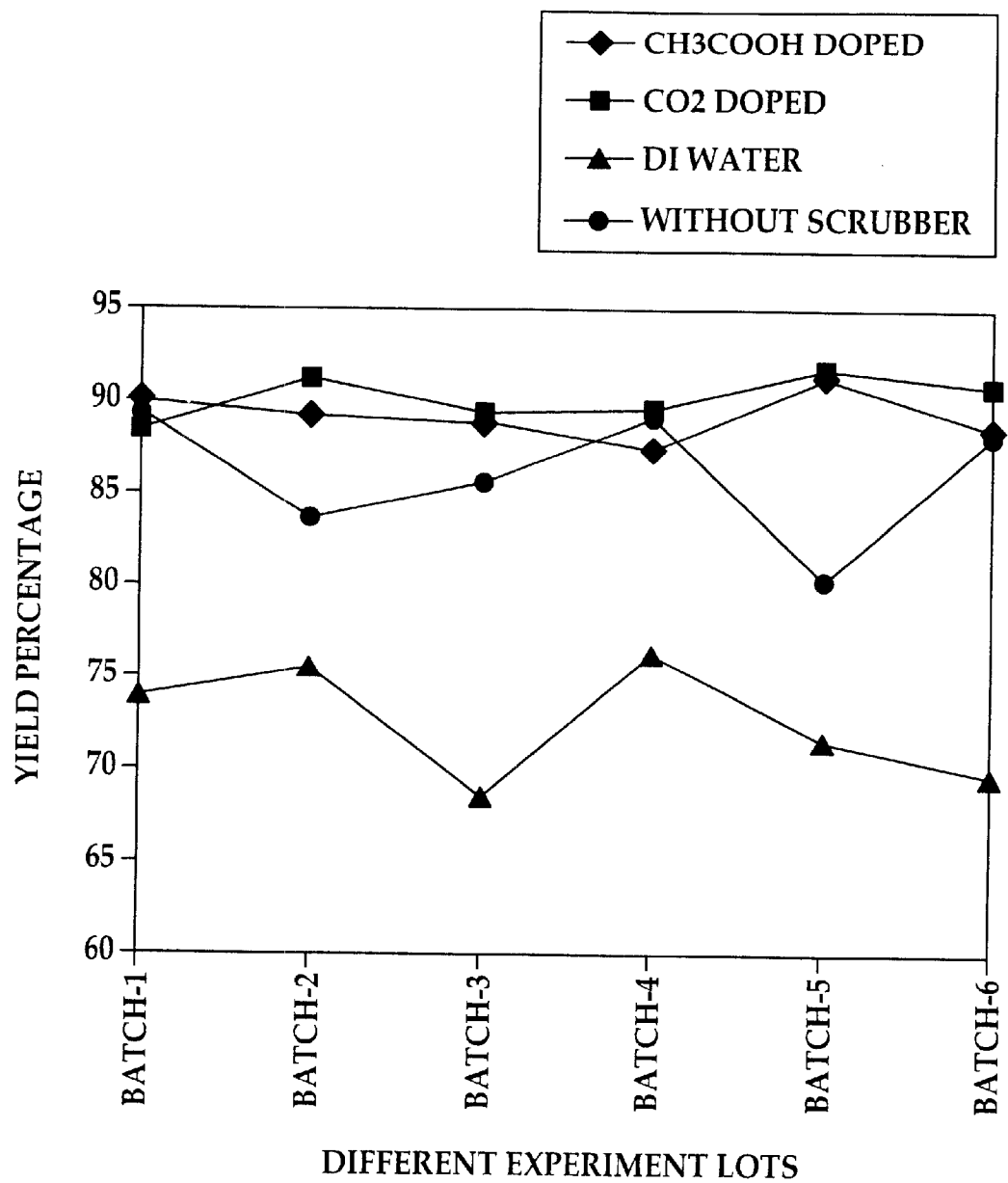
FIG. 6 is a graph illustrating the advantageous effect of the present invention method.

FIG. 6 also shows the beneficial effects achieved by the present invention method. It is seen that $CH_3COCOOH$ and $CO_2$ doped DI water can be used by a scrubber clean process to achieve 88~91% yield. In contrast, when only the DI water is used, gate oxide damages are observed around the wafer edge producing a low yet between about 65%~75%. During the tests, 12 pieces of wafers are tested in each batch while etch groups utilized 3 pieces of wafers.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for cleaning a wafer surface comprising the steps of:

providing a quantity of deionized water, adding ions to said quantity of deionized water such that the resistivity of wafer is reduced sufficiently so as to substantially not generating an electrostatic charge on the surface of the wafer, said ions are added by mixing an acid selected from the group consisting of $H_2CO_3$, and $CH_3COOH$ with said quantity of deionized water, and contacting the deionized water with a water surface.

2. A method according to claim 1, wherein said ions are added by mixing an acid selected from the group consisting of $H_2CO_3$ and $CH_3COOH$ with said quantity of deionized water in a mixing ration between about 1:100 (acid/water) and about 1:1 (acid/water).

3. A method according to claim 1, wherein the resistivity of water is reduced to less than $18 \times 10^6$ Ohm-cm.

4. A method according to claim 1, wherein said scrubbing step is conducted in a scrubber machine.

5. A method according to claim 1, wherein said deionized water contacts the wafer surface under a pressure of at least 1000 psi.

* * * * *